United States Patent [19]

Maeda et al.

[11] Patent Number: 4,660,199
[45] Date of Patent: Apr. 21, 1987

[54] MAJORITY LOGIC CIRCUIT FOR DIGITAL ERROR CORRECTION SYSTEM

[75] Inventors: Satoru Maeda, Yamato; Yasushi Noguchi, Urawa, both of Japan

[73] Assignee: Sony Corporation, Tokyo, Japan

[21] Appl. No.: 697,579

[22] PCT Filed: Jun. 1, 1984

[86] PCT No.: PCT/JP84/00280
§ 371 Date: Jan. 16, 1985
§ 102(e) Date: Jan. 16, 1985

[87] PCT Pub. No.: WO84/04984
PCT Pub. Date: Dec. 20, 1984

[30] Foreign Application Priority Data
Jun. 3, 1983 [JP] Japan .................. 58-99020

[51] Int. Cl.$^4$ .................................. G06F 11/10
[52] U.S. Cl. ........................ 371/36; 307/464
[58] Field of Search ........... 371/36, 52; 307/464

[56] References Cited
U.S. PATENT DOCUMENTS 3,784,978 1/1974 Zola .................. 371/52 X
4,309,772 1/1982 Kloker .................. 375/76
4,322,848 3/1982 Snyder .................. 371/43
4,404,674 9/1983 Rhodes .................. 371/43

OTHER PUBLICATIONS

D. J. Costello, "Error Control Coding", pp. 184–200, ©1983.
G. C. Clark, "Error-Correction Coding for Digital Communications", pp. 143–148, ©6/1981.

Primary Examiner—Jerry Smith
Assistant Examiner—Robert W. Beausoliel, Jr.
Attorney, Agent, or Firm—Lewis H. Eslinger; Alvin Sinderbrand

[57] ABSTRACT

According to this invention, there are provided a plurality of memories in which predetermined data are written and a plurality of gates. Parity check bits are grouped into a plurality of groups in response to the bit number of the addresses of the memories. Of the grouped parity checkbits, the parity checkbits corresponding to the addresses of the memories are supplied to the addresses and the outputs of the memories are supplied to the gates so as to decode the parity check bits, whereby a threshold value is identified on the basis of the outputs of the gates.

7 Claims, 2 Drawing Figures

FIG. 2

| Address | | | | | | | | | | Data DATA | | | | | | | | |
|---|---|---|---|---|---|---|---|---|---|---|---|---|---|---|---|---|---|---|
| Decimal Value | AD$_7$ | AD$_6$ | AD$_5$ | AD$_4$ | AD$_3$ | AD$_2$ | AD$_1$ | AD$_0$ | D$_7$ | D$_6$ | D$_5$ | D$_4$ | D$_3$ | D$_2$ | D$_1$ | D$_0$ | Decimal Value |
| 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 1 | 1 |
| 2 | 0 | 0 | 0 | 0 | 0 | 0 | 1 | 0 | 0 | 0 | 0 | 0 | 0 | 0 | 0 | 1 | 1 |
| 3 | 0 | 0 | 0 | 0 | 0 | 0 | 1 | 1 | 0 | 0 | 0 | 0 | 0 | 0 | 1 | 1 | 3 |
| 4 | 0 | 0 | 0 | 0 | 0 | 1 | 0 | 0 | 0 | 0 | 0 | 0 | 0 | 0 | 0 | 1 | 1 |
| 5 | 0 | 0 | 0 | 0 | 0 | 1 | 0 | 1 | 0 | 0 | 0 | 0 | 0 | 0 | 1 | 1 | 3 |
| 6 | 0 | 0 | 0 | 0 | 0 | 1 | 1 | 0 | 0 | 0 | 0 | 0 | 0 | 0 | 1 | 1 | 3 |
| 7 | 0 | 0 | 0 | 0 | 0 | 1 | 1 | 1 | 0 | 0 | 0 | 0 | 0 | 1 | 1 | 1 | 7 |
| 8 | 0 | 0 | 0 | 0 | 1 | 0 | 0 | 0 | 0 | 0 | 0 | 0 | 0 | 0 | 0 | 1 | 1 |
| 9 | 0 | 0 | 0 | 0 | 1 | 0 | 0 | 1 | 0 | 0 | 0 | 0 | 0 | 0 | 1 | 1 | 3 |
| 10 | 0 | 0 | 0 | 0 | 1 | 0 | 1 | 0 | 0 | 0 | 0 | 0 | 0 | 0 | 1 | 1 | 3 |
| 11 | 0 | 0 | 0 | 0 | 1 | 0 | 1 | 1 | 0 | 0 | 0 | 0 | 0 | 1 | 1 | 1 | 7 |
| 12 | 0 | 0 | 0 | 0 | 1 | 1 | 0 | 0 | 0 | 0 | 0 | 0 | 0 | 0 | 1 | 1 | 3 |
| 13 | 0 | 0 | 0 | 0 | 1 | 1 | 0 | 1 | 0 | 0 | 0 | 0 | 0 | 1 | 1 | 1 | 7 |
| ⋮ | ⋮ | | | ⋮ | | | ⋮ | | | ⋮ | | | ⋮ | | | | | ⋮ |
| 251 | 1 | 1 | 1 | 1 | 1 | 0 | 1 | 1 | 0 | 1 | 1 | 1 | 1 | 1 | 1 | 1 | 127 |
| 252 | 1 | 1 | 1 | 1 | 1 | 1 | 0 | 0 | 0 | 0 | 1 | 1 | 1 | 1 | 1 | 1 | 63 |
| 253 | 1 | 1 | 1 | 1 | 1 | 1 | 0 | 1 | 0 | 1 | 1 | 1 | 1 | 1 | 1 | 1 | 127 |
| 254 | 1 | 1 | 1 | 1 | 1 | 1 | 1 | 0 | 0 | 1 | 1 | 1 | 1 | 1 | 1 | 1 | 127 |
| 255 | 1 | 1 | 1 | 1 | 1 | 1 | 1 | 1 | 1 | 1 | 1 | 1 | 1 | 1 | 1 | 1 | 255 |

MAJORITY LOGIC CIRCUIT FOR DIGITAL ERROR CORRECTION SYSTEM

TECHNICAL FIELD

This invention relates to the detection of a threshold value in an error correction circuit.

BACKGROUND ART

In a character and picture image information system such as videotex, teletext and the like, when a character multiplexing of a code system is carried out, it is proposed that the (272, 190) majority-logic decodable code is used to carry out the error correction.

The (272, 190) majority-logic decodable code represents that one data packet is formed of 272 bits, in which 190 bits are assigned to information bits and remaining 82 (=272-190) bits are assigned to error correction parity bits.

However, when the (272, 190) majority-logic decodable code is used, upon decoding, the parity check is carried out by parity check bits of 17 bits, A1 to A17. Thus, the majority logic circuit must identify whether the number of "1" bits in the 17 party check bits, A1 to A17, is less than 10 or not. As a result, the majority logic circuit must comprised logic circuits for all different combinations expressed as $_{17}C_{10}$ mathematically, or 19448 different combinations, thus a great number of AND circuits and OR circuits being required.

Further, an IC on the market is generally two-input or four-input AND circuits and OR circuits and 17-input AND circuit and OR circuit are not available. Therefore, in practice, the majority logic circuit requires much more AND circuits and OR circuits and this is disadvantageous from a manufacturing cost and size or power consumption standpoint.

In addition, if the number of the AND circuits and the OR circuits used is increased, the processing speed of the majority logic circuit becomes low on the whole and this is not preferable in view of reliability.

For this reason, this invention is to provide a majority logic circuit of a very simple circuit arrangement.

DISCLOSURE OF INVENTION

In this invention, there are provided a plurality of memories in which predetermined data are stored, as well as a plurality of gates. Parity check bits are grouped into a plurality of groups in response to the bit number of the address of the memories. Of the grouped parity check bits, the parity check bits corresponding to the addresses of the memories are supplied to the addresses and the outputs of the memories are supplied to the gates so as to decode the parity check bits. A threshold value is identified on the basis of the outputs of the gates.

In consequence, according to this invention, it is possible to construct a majority logic circuit by several memories and several gate ICs.

Further, since a memory and gate IC on the market can be used as those of the majority logic circuit, the majority logic circuit can be made at low cost. Furthermore, since the majority logic circuit can be formed of several memories and several gate ICs, its space factor is excellent and the power consumption can be reduced. In addition, since the number of the circuit stages in the majority logic circuit is small, the processing speed thereof is high ahd the reliability thereof is satisfactory.

BRIEF DESCRIPTION OF DRAWINGS

FIG. 1 is a circuit diagram showing an embodiment of a majority logic circuit according to this invention and FIG. 2 is a diagram useful for the explanation thereof.

Figure 1:
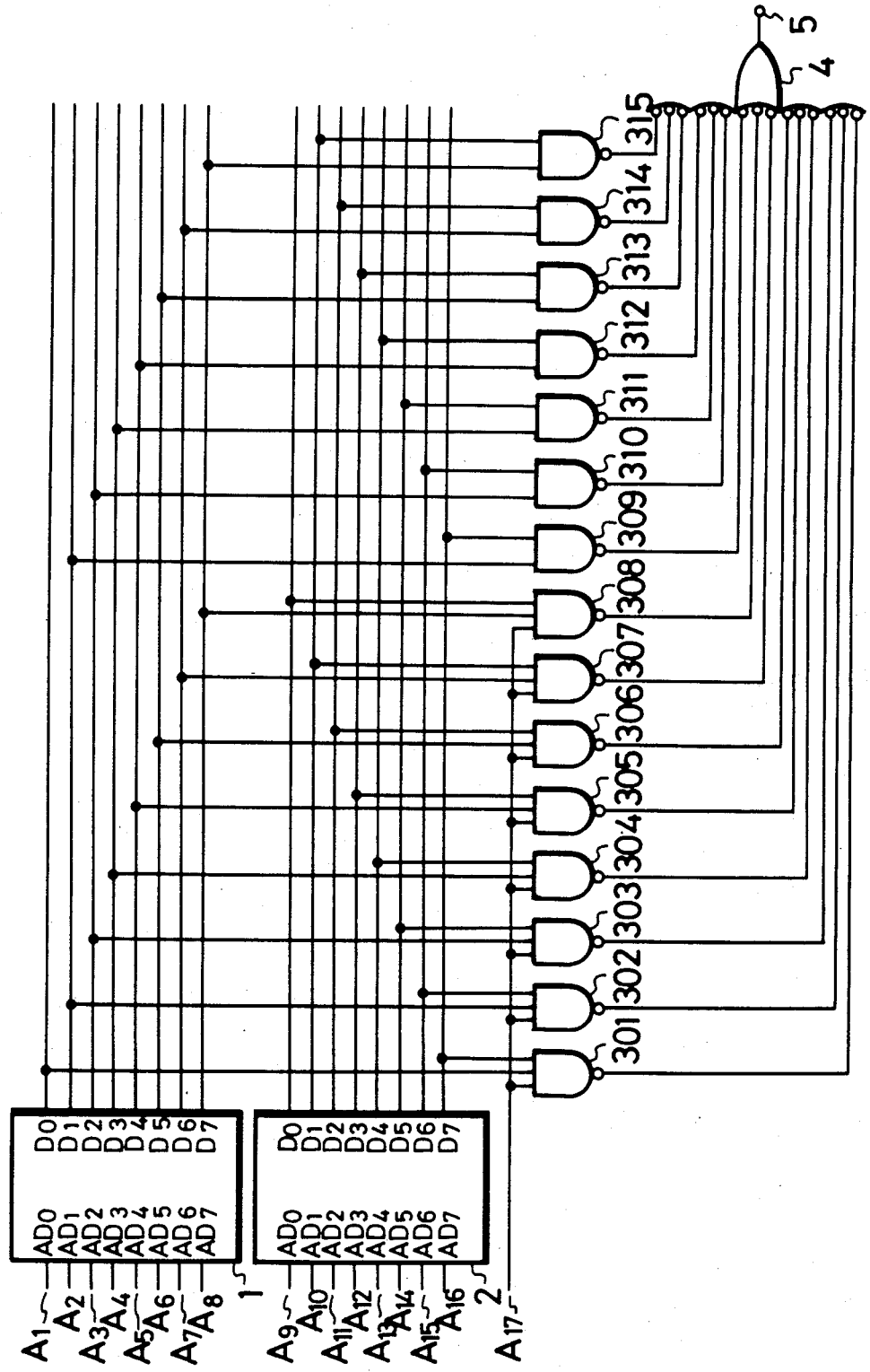

Reference numerals 1 and 2 designate ROMs and reference numerals 301 to 315 and 4 designate gates.

BEST MODE FOR CARRYING OUT THE INVENTION

FIG. 1 shows an embodiment of this invention. In FIG. 1, reference numerals 1 and 2 respectively designate 8 bit-256 bytes (256 addresses) ROMs. Data stored in the ROMs 1 and 2 are same to each other and the data stored at the respective addresses are as shown in FIG. 2.

When the address bits of the ROMs 1 and 2 are taken as AD7 to AD0 and the data bits thereof are taken as D7 to D0, if the number of the bits "1" in the address bits AD7 to AD0 is taken as N, N least significant bits (LSB) of the data bits D7 to D0 are set to "1". In other words, data DATA expressed as $$DATA = 2^N - 1$$

are stored at the addresses thereof. For example, since three (N=3) bits of the address bits AD3, AD2 and AD0 are "1" at address 13, three less significant bits D2, D1 and D0 of the data bits D7 to D0 are set to "1" and hence data expressed as $2^3 - 1 = 7$ is stored at the address.

Parity check bits A1 to A17 are grouped into 8 bits, 8 bits and 1 bit in response to the ROMs 1 and 2, for example, the parity check bits A1 to A8, A9 to A16 and A17. The parity check bits A1 to A8 are supplied to the address bits AD0 to AD7 of the ROM 1 and the parity check bits A9 to A16 are supplied to the address bits AD0 to AD7 of the ROM 2.

Further, one of the data bits D7 to D0 of the ROM 1, one of the data bits D7 to D0 of the ROM 2 and the parity check bit A17 are connected to NAND circuits 301 to 315 as follows.

If the suffix of the data bits D7 to D0 of the ROM 1 is taken as i, the suffix of the data bits D7 to D0 of the ROM 2 as j, k=0 when the address bit A17 is not connected and k=1 when the address bit A17 is connected, the connection thereamong is carried out so as to produce all NAND outputs expressed as $$(i+1)+(j+1)+k=10$$
$$\therefore i+j+k=8$$

For example, the NAND circuit 302 is connected with the data bit D1 of the ROM 1, the data bit D6 of the ROM 2 and the address bit A17 (i=1, j=6 and k=1), while the NAND circuit 309 is connected with the data bit D1 of the ROM 1, the data bit D7 of the ROM 2 and not connected with the address bit A17 (i=1, j=7 and k=0).

Then, the outputs of these NAND circuits 301 to 315 are supplied to an OR circuit 4 of negative logic input the OR output of which is fed to a terminal 5.

According to the circuitry thus made, when m bits of the parity check bits A1 to A8 become "1", n bits of the parity check bits A9 to A16 become "1" and when A17="0" is satisfied, the following condition is established as $$i + j + k = (m - 1) + (n - 1) + 0$$
$$= m + n - 2$$

Thus, when the condition, $m+n \geq 10$ is established, the output of the corresponding NAND circuit of the NAND circuits 309 to 315 becomes "0" and hence the output of the OR circuit 4 becomes "1".

Further, when the condition, $A17=$"1" is established, the following equation is established as $$i + j + k = (m - 1) + (n - 1) + 1$$
$$= m + n - 1$$

Thus, when the condition, $m+n \geq 9$ is established, the output of the corresponding NAND circuit of the NAND circuits 301 to 308 becomes "0" and hence the output of the OR circuit 4 becomes "1".

As a result, according to this invention, when more than 10 bits of the parity check bits A1 to A17 become "1", the output at the terminal 5 becomes "1" so that it is possible to detect the existence of error.

In this case, particularly in accordance with this invention, the majority logic circuit can be formed of the two ROMs 1 and 2 of a small capacity and several gate ICs. In other words, the parity check bits A1 to A17 are grouped, the ROMs 1 and 2 of a small capacity are enough. Further, in the gate IC on the market, four to three 2-input or 3-input NAND circuits are formed on a single IC. Further, the OR circuit 4 can be realized by two 8-input OR circuits or one 16-input OR circuit. The IC of the 8-input OR circuit is also sold on the market. Therefore, according to this invention, the majority logic circuit can be made by the two ROMs 1 and 2 of small capacity and several gate ICs.

Accordingly, as the ROMs 1 and 2 and the circuits 301 to 315 and 4, it is possible to use ROMs and gate ICs which appear on the market so that the majority logic circuit of this invention can be made at low cost. Further, since the majority logic circuit of this invention can be made by the two ROMs 1 and 2 and several gate ICs, its space factor is excellent and the power consumption can be reduced.

Furthermore, since the number of stages is small, the delay of the processing speed of the majority logic circuit is small and the reliability thereof is excellent.

In addition, while the relation between the address and the data as shown in FIG. 2 and the connection relation between the circuits 301 to 315 and 4 can be tabulated and processed by a software, it is possible to carry out the processing at higher speed than that of such case.

In the above, it is possible that the ROMs 1 and 2 are exchanged to RAMs and upon use, these RAMs are initialized as shown in FIG. 2. Further, the ROMs 1 and 2 may be 4-byte ROMs or 512 bytes ROMs.

What is claimed is:

1. A majority logic circuit for identifying whether incoming parity check bits include a plurality of true bits more numerous than a predetermined number comprising:
   a plurality of memory means in which predetermined data are written;
   means for grouping said incoming parity check bits into a plurality of groups greater than two;
   means for supplying less than all of said plurality of groups of said parity check bits to addresses of respective ones of said plurality of memory means;
   a plurality of first gate means each supplied with selected outputs of said memory means and selected ones of said plurality of first gate means supplied directly with remaining ones of said parity check bits not supplied to said memory means; and
   second gate means supplied with all outputs of said first gate means for generating an identifying signal.

2. A majority logic circuit as cited in claim 1, wherein said incoming parity check bits are 17 bits and grouped into first, second and third groups.

3. A majority logic circuit as cited in claim 2, wherein said memory means includes first memory means and second memory means, and said first and second groups of the parity check bits are supplied to said first and second memory means, respectively.

4. A majority logic circuit as cited in claim 3, wherein said first and second memory means are 8 bit-parallel 256 bytes ROMs, respectively.

5. A majority logic circuit as cited in claim 4, wherein said first gate means are divided into a first group and a second group.

6. A majority logic circuit as cited in claim 5, wherein said first group of the first gate means is supplied with the outputs of said first and second memory means and said third group of the parity check bits, and said second group of the second gate means is supplied with the outputs of the first and second memory means.

7. A majority logic circuit as cited in claim 6, wherein when the number of true bits at address inputs is N, the lower N bits of said predetermined data become true bits in said first and second memory means.

* * * * *